United States Patent
Bae et al.

(10) Patent No.: US 9,455,698 B2
(45) Date of Patent: Sep. 27, 2016

(54) GATE DRIVER AND DISPLAY DEVICE INCLUDING THE SAME

(71) Applicant: Samsung Display Co., LTD., Yongin, Gyeonggi-Do (KR)

(72) Inventors: Min-Seok Bae, Yongin (KR); Chul Min Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 236 days.

(21) Appl. No.: 13/923,359

(22) Filed: Jun. 20, 2013

(65) Prior Publication Data

US 2014/0022228 A1 Jan. 23, 2014

(30) Foreign Application Priority Data

Jul. 18, 2012 (KR) .................. 10-2012-0078304

(51) Int. Cl.
*H03K 17/16* (2006.01)
*G09G 5/00* (2006.01)
*G09G 3/36* (2006.01)
*G11C 19/28* (2006.01)

(52) U.S. Cl.
CPC ............ *H03K 17/16* (2013.01); *G09G 3/3648* (2013.01); *G09G 3/3677* (2013.01); *G09G 5/001* (2013.01); *G11C 19/28* (2013.01); *H03K 17/162* (2013.01); *G09G 2310/0224* (2013.01)

(58) Field of Classification Search
None
See application file for complete search history.

(56) References Cited

U.S. PATENT DOCUMENTS

| | | | |
|---|---|---|---|
| 5,434,899 A | 7/1995 | Huq et al. | |
| 6,295,046 B1 * | 9/2001 | Hebiguchi | 345/100 |
| 7,289,593 B2 | 10/2007 | Tobita et al. | |
| 7,548,228 B2 | 6/2009 | Pak et al. | |
| 8,045,675 B2 * | 10/2011 | Chan | G11C 19/28 377/64 |
| 2005/0275609 A1 * | 12/2005 | Lee et al. | 345/82 |
| 2006/0145991 A1 | 7/2006 | Jang et al. | |
| 2007/0040792 A1 | 2/2007 | Kwag et al. | |
| 2007/0195053 A1 * | 8/2007 | Tobita et al. | 345/100 |
| 2007/0247932 A1 | 10/2007 | Tobita | |
| 2008/0001904 A1 * | 1/2008 | Kim et al. | 345/100 |
| 2008/0012818 A1 | 1/2008 | Lee et al. | |
| 2008/0079701 A1 * | 4/2008 | Shin et al. | 345/204 |
| 2008/0187089 A1 | 8/2008 | Miyayama et al. | |
| 2008/0266477 A1 * | 10/2008 | Lee et al. | 349/46 |

(Continued)

FOREIGN PATENT DOCUMENTS

| | | |
|---|---|---|
| JP | 2006-189767 | 7/2006 |
| JP | 2008-193545 | 8/2008 |

(Continued)

OTHER PUBLICATIONS

U.S. Office action dated Jun. 20, 2014, for cross reference U.S. Appl. No. 13/046,573 (Now U.S. Pat. No. 9,035,865), (21 pages).

*Primary Examiner* — Claire X Pappas
*Assistant Examiner* — Benjamin Casarez
(74) *Attorney, Agent, or Firm* — Lewis Roca Rothgerber Christie LLP (57) ABSTRACT

A gate driver is provided. The gate driver includes a plurality of cascade-connected stages. The k-th stage of the stages includes a switching unit for connecting a first node to a second node, a driving unit for generating an output signal in accordance with a voltage of the first node, and an input unit for inputting an output signal of a (k−1)-th stage of the stages and an output signal of a (k+1)-th stage of the stages to the second node.

18 Claims, 10 Drawing Sheets

(56) References Cited

U.S. PATENT DOCUMENTS

| | | |
|---|---|---|
| 2009/0086116 A1 | 4/2009 | Pak |
| 2010/0007635 A1* | 1/2010 | Kwon et al. ............... 345/204 |
| 2010/0026669 A1* | 2/2010 | Lee et al. .................. 345/204 |
| 2010/0309184 A1* | 12/2010 | Yamamoto et al. ......... 345/209 |
| 2011/0221736 A1* | 9/2011 | Pak et al. .................. 345/211 |
| 2012/0008731 A1* | 1/2012 | Hsu ....................... G11C 19/28 377/79 |
| 2012/0146978 A1* | 6/2012 | Park et al. ................ 345/211 |
| 2012/0194489 A1* | 8/2012 | Iwamoto ............. G09G 3/3685 345/204 |

FOREIGN PATENT DOCUMENTS

| | | |
|---|---|---|
| KR | 10-2006-0134615 | 12/2006 |
| KR | 10-2007-0079489 | 8/2007 |
| KR | 10-2008-0030212 | 4/2008 |
| KR | 10-2009-0032712 | 4/2009 |
| WO | WO 2011162057 A1 * | 12/2011 |

\* cited by examiner

GATE DRIVER AND DISPLAY DEVICE INCLUDING THE SAME

CROSS-REFERENCE TO RELATED APPLICATION

This application claims priority to and the benefit of Korean Patent Application No. 10-2012-0078304, filed on Jul. 18, 2012 in the Korean Intellectual Property Office, the entire content of which is incorporated herein by reference.

BACKGROUND

1. Field

Aspects of the present invention relate to a gate driver and a display device including the gate driver.

2. Description of the Prior Art

An example display device includes a plurality of pixels arranged in a matrix shape and displays colors and gray levels according to data signals transferred to the pixels. The display device includes a data driving unit (for example, a data driver) for generating the data signals. The data driver generates the data signals that correspond to an image to be displayed by the display device. The pixels receive the data signals in accordance with a gate signal. The display device includes a gate driving unit (for example, a gate driver) for generating the gate signal. The gate driver includes a plurality of shift registers. The shift registers are sequentially driven to generate a gate-on signal for enabling the pixels to receive the data signal.

SUMMARY

Embodiments of the present invention provide for a gate driver and a display device including the gate driver. The shift register included in the gate driver includes a plurality of transistors. The characteristics of the transistors may change depending on the surrounding environment. For example, with an increase in temperature, a graph that represents current flowing to the drain of a transistor with respect to a voltage Vgs between the gate and source of the transistor (i.e., the gate-source voltage) may shift to the left. If the characteristics of the transistor change depending on the surrounding environment, the gate driver may malfunction, and the display device may not display a desired image. Accordingly, embodiments of the present invention provide for a gate driver that can reduce such transistor malfunctions. Additional embodiments of the present invention provide for a display device that includes such a gate driver.

According to an exemplary embodiment of the present invention, a gate driver is provided. The gate driver includes a plurality of cascade-connected stages. A k-th stage of the stages includes a switching unit for connecting a first node to a second node, a driving unit for generating an output signal in accordance with a voltage of the first node, and an input unit for inputting an output signal of a (k−1)-th stage of the stages and an output signal of a (k+1)-th stage of the stages to the second node.

The k-th stage may further include an output terminal for outputting the output signal. The driving unit may include a boosting capacitor between the output terminal and the first node. The boosting capacitor may be configured to boost a voltage of the first node by a voltage of the output terminal when the first node is in a high impedance state.

The k-th stage may further include a leakage current interception unit for intercepting leakage current from the first node to the second node by maintaining high impedance between the second node and the first node when the first node is in a high impedance state.

The input unit may include a first diode-connected transistor for inputting the output signal of the (k−1)-th stage to the second node, and a second diode-connected transistor for inputting the output signal of the (k+1)-th stage to the second node.

The input unit may be configured to input the output signal to the second node.

The input unit may include a third diode-connected transistor for inputting the output signal to the second node.

The k-th stage may be configured to reset a voltage of the first node and the output signal.

The k-th stage may further include a reset unit connected to a reset terminal for receiving a reset signal and a gate-off terminal for receiving a gate-off signal. The reset unit includes: a fourth transistor including a gate electrode connected to the reset terminal, a first electrode connected to the first node, and a second electrode connected to the second node; and a fifth transistor including a gate electrode connected to the reset terminal, a first electrode connected to the second node, and a second electrode connected to the gate-off terminal.

The k-th stage may further include an output terminal for outputting the output signal. The reset unit may further include a sixth transistor including a gate electrode connected to the reset terminal, a first electrode connected to the output terminal, and a second electrode connected to the gate-off terminal.

In the k-th stage, the switching may be configured to connect the first node to the second node in accordance with an output signal of a (k−2)-th stage of the stages and an output signal of a (k+2)-th stage of the stages.

According to another exemplary embodiment of the present invention, a display device is provided. The display device includes a display panel and a gate driver for providing a gate signal to the display panel. The gate driver includes a plurality of cascade-connected stages. A k-th stage of the stages includes a switching unit for connecting a first node to a second node, a driving unit for generating an output signal in accordance with a voltage of the first node, and an input unit for inputting an output signal of a (k−1)-th stage of the stages and an output signal of a (k+1)-th stage of the stages to the second node.

The k-th stage may further include an output terminal for outputting the output signal. The driving unit may include a boosting capacitor between the output terminal and the first node. The boosting capacitor may be configured to boost a voltage of the first node by a voltage of the output terminal when the first node is in a high impedance state.

The k-th stage may further include a leakage current interception unit for intercepting leakage current from the first node to the second node by maintaining high impedance between the second node and the first node when the first node is in a high impedance state.

The input unit may include a first diode-connected transistor for inputting the output signal of the (k−1)-th stage to the second node, and a second diode-connected transistor for inputting the output signal of the (k+1)-th stage to the second node.

The input unit may be configured to input the output signal to the second node.

The input unit may include a third diode-connected transistor for inputting the output signal to the second node.

The k-th stage may be configured to reset a voltage of the first node and the output signal.

The k-th stage may further include a reset unit connected to a reset terminal for receiving a reset signal and a gate-off terminal for receiving a gate-off signal. The reset unit may include: a fourth transistor including a gate electrode connected to the reset terminal, a first electrode connected to the first node, and a second electrode connected to the second node; and a fifth transistor including a gate electrode connected to the reset terminal, a first electrode connected to the second node, and a second electrode connected to the gate-off terminal.

The k-th stage may further include an output terminal for outputting the output signal. The reset unit may further include a sixth transistor including a gate electrode connected to the reset terminal, a first electrode connected to the output terminal, and a second electrode connected to the gate-off terminal.

In the k-th stage, the switching unit may be configured to connect the first node to the second node in accordance with an output signal of a (k−2)-th stage of the stages and an output signal of a (k+2)-th stage of the stages.

Additional aspects and features of the present invention will be set forth in part in the description that follows and in part will become apparent to those having ordinary skill in the art upon examination of the following or may be learned from practice of the invention.

BRIEF DESCRIPTION OF THE DRAWINGS

The above and other features and aspects of the present invention will be more apparent from the following detailed description taken in conjunction with the accompanying drawings in which.

DETAILED DESCRIPTION

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided to more fully convey the scope of the present invention to those skilled in the art. The same reference numbers indicate the same components throughout the specification. In the attached figures, the thickness of layers and regions may be exaggerated for clarity.

Unless defined otherwise, all technical and scientific terms used herein have the same meaning as commonly understood by one of ordinary skill in the art to which this invention belongs. It is noted that the use of any examples or exemplary terms provided herein is intended to better illuminate the present invention and is not a limitation on the scope of the invention unless otherwise specified. Further, unless defined otherwise, terms defined in generally used dictionaries may not be overly interpreted.

Figure 1:
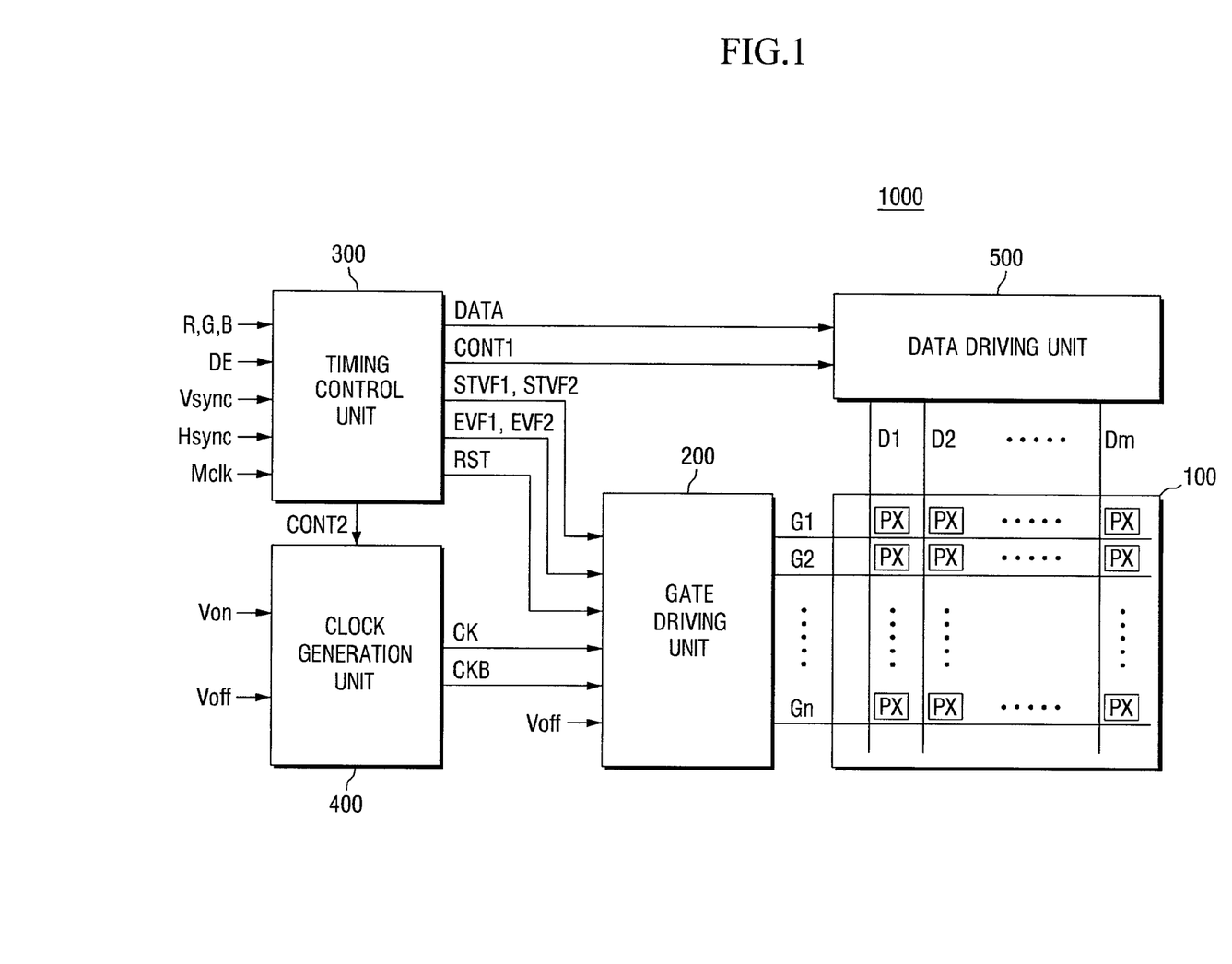
FIG. 1 is a block diagram of a display device according to an embodiment of the present invention.

FIG. 1 is a block diagram of a display device 1000 according to an embodiment of the present invention.

The display device 1000 includes a display panel 100 and a gate driving unit (for example, a gate driver) 200. The display panel 100 includes a plurality of gate lines G1, G2, . . . , and Gn, a plurality of data lines D1, D2, . . . , and Dm, and a plurality of pixels PX defined by crossing areas of the gate lines G1, G2, . . . , and Gn and the data lines D1, D2, . . . , and Dm. The pixels PX display gray levels that correspond to data signals applied to the data lines D1, D2, . . . , and Dm, and receive the data signals in accordance with a gate signal applied to the gate lines G1, G2, . . . , and Gn. An exemplary pixel PX will now be described in more detail with reference to FIG. 2.

Figure 2:
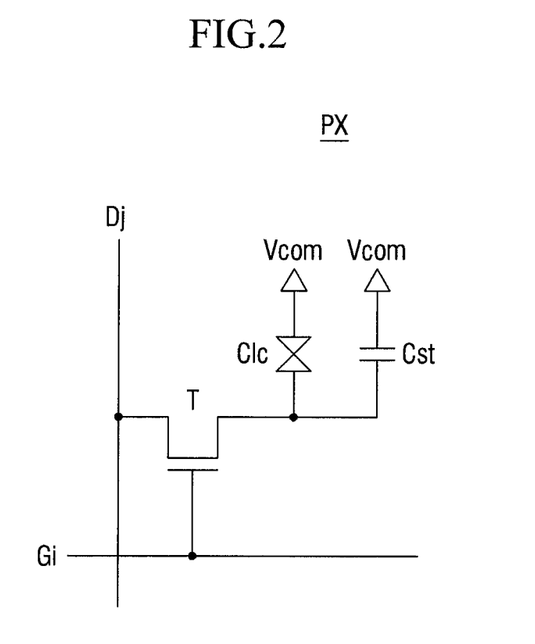
FIG. 2 is a circuit diagram of a pixel according to an embodiment of the present invention.

FIG. 2 is a circuit diagram of the pixel PX according to an embodiment of the present invention. The pixel PX is described in reference to the display panel 100 being a liquid crystal panel. However, this is merely exemplary, and in other embodiments, the display panel 100 may be a different type of display panel, such as an organic electroluminescent display panel, a plasma display panel, a field emission display panel, or an electrophoretic display panel.

Referring to FIG. 2, the pixel PX includes a transistor T, a liquid crystal capacitor Clc, and a storage capacitor Cst. The transistor T may be, for example, a thin film transistor. As shown in FIG. 2, a gate of the transistor T is connected to the i-th gate line Gi, a source thereof is connected to the j-th data line Dj, and a drain thereof is connected to one end of the liquid crystal capacitor Clc and of the storage capacitor Cst. Here, i is a natural number between 1 and n, and j is a natural number between 1 and m. The transistor T transfers the data signal applied to the j-th data line Dj to the one end of the liquid crystal capacitor Clc and the storage capacitor Cst in accordance with the scan signal applied to the i-th gate line Gi.

The liquid crystal capacitor Clc may be, for example, a virtual capacitor that indicates a capacitance component of a liquid crystal layer between a pixel electrode to which the data signal is applied and a common electrode to which a common voltage Vcom is applied. The light transmissivity of the liquid crystal layer may be controlled depending on the potential difference between both ends of the liquid crystal capacitor Clc. In FIG. 2, one end of the liquid crystal capacitor Clc is connected to the drain of the transistor T, and the other end receives the common voltage Vcom.

In a similar fashion, one end of the storage capacitor Cst is connected to the drain of the transistor T, and the other end receives the common voltage Vcom. That is, the storage capacitor Cst is arranged in parallel to the liquid crystal capacitor Clc. The storage capacitor Cst increases the capacitance between the pixel electrode and the common electrode to maintain the voltage applied at both ends of the liquid crystal capacitor Clc more efficiently when the transistor T is turned off. In some embodiments of the present invention, the storage capacitor Cst is omitted.

Referring again to the exemplary embodiment of FIG. 1, the gate driver 200 provides the gate signal to the respective gate lines G1, G2, . . . , and Gn using a first start pulse signal STVF1, a second start pulse signal STVF2, a first end pulse signal EVF1, a second end pulse signal EVF2, a reset signal RST, a clock signal CK, an inverted clock signal CKB, and a gate-off signal (for example, a gate-off voltage) Voff. An exemplary gate driver 200 will be described later with reference to FIG. 3.

The display device 1000 further includes a timing control unit (for example, a timing controller) 300, a data driving unit (for example, a data driver) 500, and a clock generation unit (for example, a clock generator) 400. The timing controller 300 receives input image signals R, G, B and input control signals for controlling the display of the input image signals R, G, B, and generates and provides image data signals DATA and a data driver control signal CONT1 to the data driver 500. The timing controller 300 receives the input control signals, such as a vertical synchronization signal Vsync, a horizontal synchronization signal Hsync, a main clock signal Mclk, and a data enable signal DE, and outputs the data driver control signal CONT1. The data driver control signal CONT1 is for controlling the operation of the data driver 500, and may include, for example, a horizontal start signal for starting the operation of the data driver 500, a load signal for controlling an output of a data voltage, and the like.

In addition, the timing controller 300 provides a clock generation control signal CONT2 to the clock generator 400. The clock generation control signal CONT2 may include, for example, a gate clock signal for controlling an output time of a gate-on voltage Von of the clock generator 400 and an output enable signal for controlling a pulse width of the gate-on voltage Von. Further, the timing controller 300 provides the first start pulse signal STVF1, the second start pulse signal STVF2, the first end pulse signal EVF1, the second end pulse signal EVF2, and the reset signal RST to the gate driver 200.

The data driver 500 receives the image data signals DATA and the data driver control signal CONT1, and provides data signals that correspond to the image data signals DATA to the data lines D1 to Dm. The clock generator 400 generates the clock signal CK and the inverted clock signal CKB corresponding to the clock generation control signal CONT2. The inverted clock signal CKB may be, for example, an inverted signal of the clock signal CK or a signal having a delay of ½ period from the clock signal CK. The gate driver 200 will now be described in more detail with reference to FIG. 3.

Figure 3:
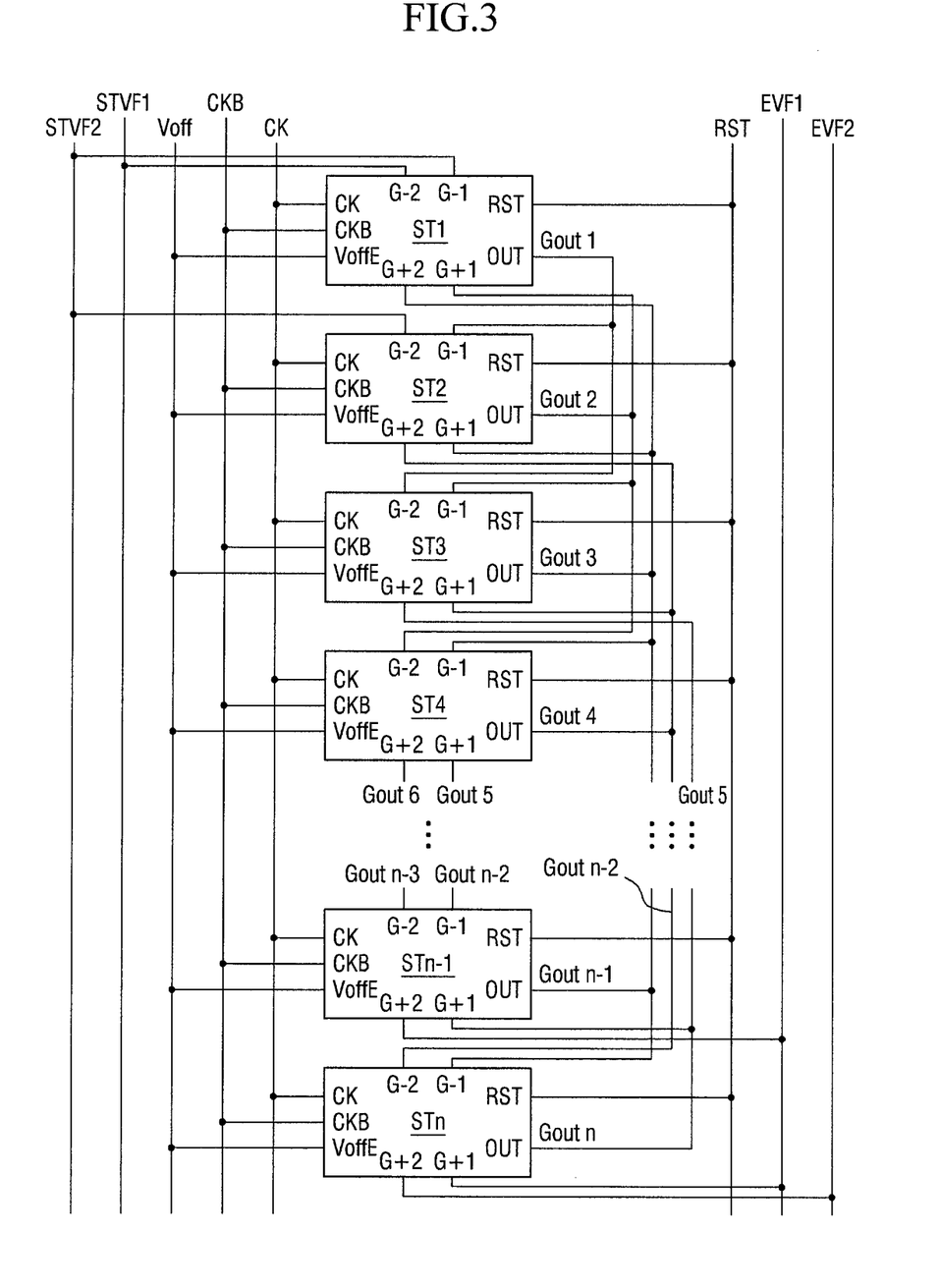
FIG. 3 is a block diagram of a gate driver according to an embodiment of the present invention.

FIG. 3 is a block diagram of the gate driver 200 according to an embodiment of the present invention.

The gate driver 200 includes first to n-th stages ST1, ST2, . . . , and STn that are cascade-connected to one another. Each of the first to n-th stages ST1, ST2, . . . , and STn includes a first input terminal G−2, a second input terminal G−1, a third input terminal G+1, a fourth input terminal G+2, the clock terminal CK, the inverted clock terminal CKB, the off-voltage terminal VoffE, the reset terminal RST, and the output terminal OUT.

The first input terminal G−2 of the k-th stage STk is connected to the output terminal OUT of the (k−2)-th stage STk−2, with the first input terminal G−2 of the first stage ST1 receiving the first start pulse signal STVF1 and the first input terminal G−2 of the second stage ST2 receiving the second start pulse signal STVF2. The second input terminal G−1 of the k-th stage STk is connected to the output terminal OUT of the (k−1)-th stage STk−1, with the second input terminal G−1 of the first stage ST1 receiving the second start pulse signal STVF2. The third input terminal G+1 of the k-th stage STk is connected to the output terminal OUT of the (k+1)-th stage STk+1, with the third input terminal G+1 of the n-th stage STn receiving the first end pulse signal EVF1. The fourth input terminal G+2 of the k-th stage STk is connected to the output terminal OUT of the (k+2)-th stage STk+2, with the fourth input terminal G+2 of the n-th stage STn receiving the second end pulse signal EVF2 and the fourth input terminal G+2 of the (n−1)-th stage STn−1 receiving the first end pulse signal EVF1.

The first to n-th output signals Gout1, Gout2, . . . , and Goutn respectively output through the output terminals OUT of the first to n-th stages ST1, ST2, . . . , and STn are gate signals respectively applied to the first to n-th gate lines G1, G2, . . . , and Gn. The clock signal CK and the inverted clock signal CKB generated from the clock generator 400 are respectively input to the clock terminal CK and the inverted clock terminal CKB. The gate-off voltage Voff is applied to the off-voltage terminal VoffE. The reset signal RST is input to the reset terminal RST. The k-th stage STk included in the gate driver 200 will now be described in more detail with reference to FIG. 4.

Figure 4:
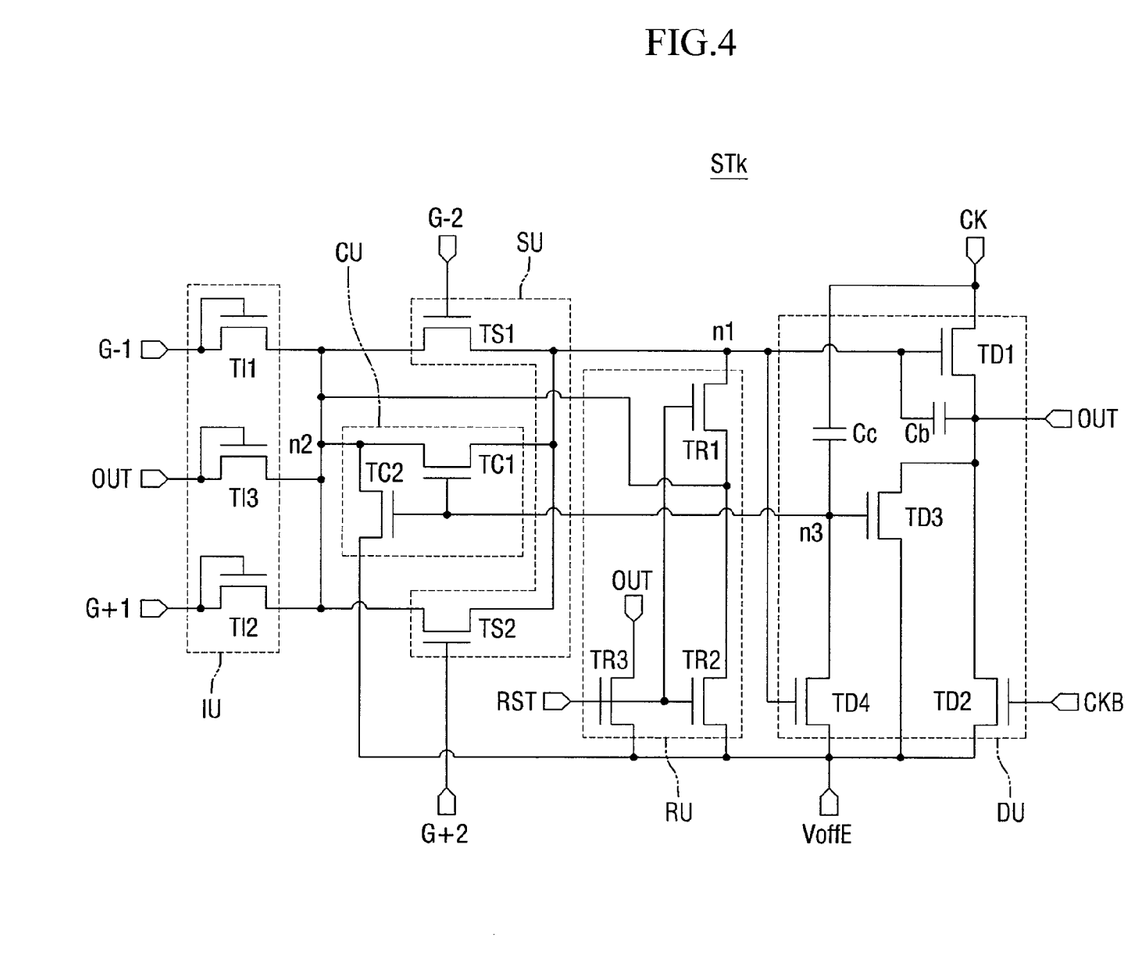
FIG. 4 is a circuit diagram of a k-th stage according to an embodiment of the present invention.

FIG. 4 is a circuit diagram of the k-th stage STk according to an embodiment of the present invention. Here, k is a natural number between 1 and n. The k-th stage STk includes an input unit IU, a leakage current interception unit CU, a switching unit SU, a reset unit RU, and a driving unit DU.

The input unit IU includes a first input transistor TI1, a second input transistor TI2, and a third input transistor TI3. The first input transistor TI1 is arranged between the second input terminal G−1 and a second node n2, and is diode-connected to transfer the signal received by the second input terminal G−1 to the second node n2. The second input transistor TI2 is arranged between the third input terminal G+1 and the second node n2, and is diode-connected to transfer the signal received by the third input terminal G+1 to the second node n2. Accordingly, when the voltage of the second node n2 is in a high-level state, the first input transistor TI1 or the second input transistor TI2 is turned on to connect the second node n2 to the second input terminal G−1 or the third input terminal G+1 and thus, a period in which the second node n2 is floated is reduced or disappears. Therefore, the possibility that the transistors malfunction can be lowered even if the characteristics of the transistors included in the k-th stage STk change depending on the surrounding environment.

The third input transistor TI3 is arranged between the output terminal OUT of the k-th stage STk and the second node n2, and is diode-connected to transfer the signal applied to the output terminal OUT to the second node n2. Accordingly, the second node n2 may be connected to the output terminal OUT in addition to the second input terminal G−1 or the third input terminal G+1. Therefore, the possibility that the transistors malfunction can be further lowered even if the characteristics of the transistors included in the k-th stage STk change depending on the surrounding environment.

The switching unit SU is arranged between a first node n1 and the second node n2. The switching unit SU controls a connection between the first node n1 and the second node n2. The switching unit SU is connected to the first input terminal G−2 and the fourth input terminal G+2. The switching unit SU includes a first switching transistor TS1 and a second switching transistor TS2. The gate electrode of the first switching transistor TS1 is connected to the first input terminal G−2, and the first electrode and the second electrode thereof are connected to the second node n2 and the first node n1, respectively. The first electrode is one of a source electrode or a drain electrode, and the second electrode is the other one of the source electrode or the drain electrode. For example, if the first electrode is the source electrode, the second electrode is the drain electrode, and vice versa. The first switching transistor TS1 is turned on when the signal applied to the first input terminal G−2 is in a high-level state and connects the first node n1 to the second node n2.

The gate electrode of the second switching transistor TS2 is connected to the fourth input terminal G+2, and the first electrode and the second electrode thereof are connected to the second node n2 and the first node n1, respectively. The second switching transistor TS2 is turned on when the signal applied to the fourth input terminal G+2 is in a high-level state and connects the first node n1 to the second node n2.

The driving unit DU is connected to the first node n1, the clock terminal CK, the inverted clock terminal CKB, the off-voltage terminal VoffE, and the output terminal OUT. The driving unit DU outputs the output signal Goutk to the output terminal OUT corresponding to the voltage of the first node n1 and the signals applied to the clock terminal CK, the inverted clock terminal CKB, and the off-voltage terminal VoffE.

The driving unit DU includes first to fourth driving transistors TD1, TD2, TD3, and TD4, a coupling capacitor Cc, and a boost capacitor Cb. The gate electrode of the first driving transistor TD1 is connected to the first node n1, the first electrode thereof is connected to the clock terminal CK, and the second electrode thereof is connected to the output terminal OUT. The boost capacitor Cb is connected between the first node n1 and the output terminal OUT. The gate electrode of the second driving transistor TD2 is connected to the inverted clock terminal CKB, the first electrode thereof is connected to the output terminal OUT, and the second electrode thereof is connected to the off-voltage terminal VoffE. The gate electrode of the third driving transistor TD3 is connected to a third node n3, the first electrode thereof is connected to the output terminal OUT, and the second electrode thereof is connected to the off-voltage terminal VoffE. The gate electrode of the fourth driving transistor TD4 is connected to the first node n1, the first electrode thereof is connected to the third node n3, and the second electrode thereof is connected to the off-voltage terminal VoffE.

The first driving transistor TD1 generates the output signal Goutk depending on the voltage of the first node n1 and outputs the output signal Goutk to the output terminal OUT. To better secure the full swing (i.e., intended difference between low and high voltages) of the output signal Goutk, the boost capacitor Cb boosts the voltage of the first node n1 to secure the voltage difference between the gate electrode and the second electrode of the first driving transistor TD1.

The leakage current interception unit CU is connected to the first node n1, the second node n2, the third node n3, and the off-voltage terminal VoffE. When the first node n1 is in a high impedance state, the leakage current interception unit CU is configured to intercept the leakage current from the first node n1 to the second node n2 node by maintaining the high impedance between the first node n1 and the second node n2 when the voltage of the second node n2 is equal to or higher than a set voltage (for example, a predetermined voltage).

The leakage current interception unit CU includes a first interception transistor TC1 and a second interception transistor TC2. The gate electrode of the first interception transistor TC1 is connected to the third node n3, the first electrode thereof is connected to the second node n2, and the second electrode thereof is connected to the first node n1. The gate electrode of the second interception transistor TC2 is connected to the third node n3, the first electrode thereof is connected to the second node n2, and the second electrode thereof is connected to the gate-off terminal VoffE.

The reset unit RU includes first to third reset transistors TR1, TR2, and TR3. The gate electrode of the first reset transistor TR1 is connected to the reset terminal RST, the first electrode thereof is connected to the first node n1, and the second electrode thereof is connected to the second node n2. The gate electrode of the second reset transistor TR2 is connected to the reset terminal RST, the first electrode thereof is connected to the second node n2, and the second electrode thereof is connected to the off-voltage terminal VoffE. The gate electrode of the third reset transistor TR3 is connected to the reset terminal RST, the first electrode thereof is connected to the output terminal OUT, and the second electrode thereof is connected to the off-voltage terminal VoffE. The operation of the k-th stage STk will be described in more detail with reference to FIG. 5.

Figure 5:
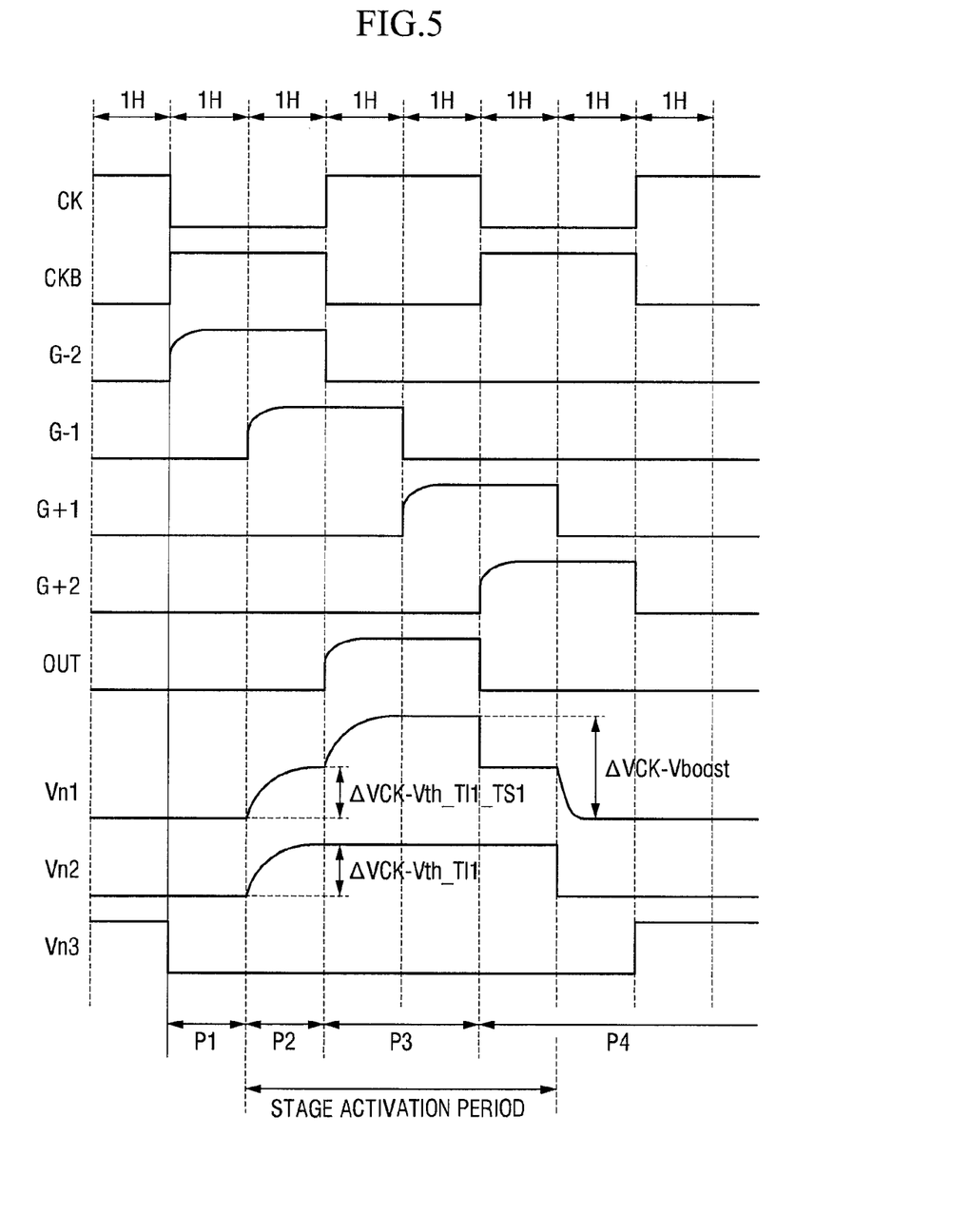
FIG. 5 is a timing diagram illustrating the operation of the k-th stage according to an embodiment of the present invention.

FIG. 5 is a timing diagram illustrating the operation of the k-th stage STk according to an exemplary embodiment of the present invention.

In FIG. 5, Vn1, Vn2, and Vn3 respectively denote voltages of the first to third nodes n1, n2, and n3. In a first period P1, the third node n3 is coupled to the clock terminal CK through the coupling capacitor Cc, and has the gate-off voltage Voff. The first switching transistor TS1 is turned on by the gate-on voltage Von that is applied to the first input terminal G−2, so the first node n1 and the second node n2 are connected to each other. The second driving transistor TD2 is turned on by the gate-on voltage Von that is applied to the inverted clock terminal CKB, so the gate-off voltage Voff of the off-voltage terminal VoffE is applied to the output terminal OUT and thus, the output terminal OUT has the gate-off voltage Voff.

In a second period P2, precharging of the first node n1 is performed. The second input terminal G−1 has the gate-on voltage Von to turn on the first input transistor TI1, and the gate-on voltage Von is applied to the second node n2. The first switching transistor TS1 is kept on by the first input terminal G−2, so the voltage of the first node n1 and the second node n2 increase in accordance with the gate-on voltage Von. The voltage Vn2 of the second node is precharged to a swing width ΔVCK of the clock signal minus a threshold voltage Vth_TI1 of the first input transistor TI1 (i.e., ΔVCK−Vth_TI1). The voltage Vn1 of the first node is precharged up to the swing width ΔVCK of the clock signal minus a sum Vth_TI1_TS1 of the threshold voltage of the first input transistor TI1 and the threshold voltage of the first switching transistor TS1 (i.e., ΔVCK−Vth_TI1_TS1).

Thus, the voltage levels of the first node n1 and the second node n2 gradually increase by the capacitance component of the first node n1. The third node n3 maintains the gate-off voltage Voff. The second driving transistor TD2 remains turned on by the inverted clock signal CKB, so the output terminal OUT maintains the gate-off voltage Voff. The second input transistor TI2, the second switching transistor TS2, the first interception transistor TC1, and the second interception transistor TC2 are turned off in the first and second periods P1 and P2.

In a third period P3, the first and fourth input terminals G−2 and G+2 have the gate-off voltage Voff, so the first and second switching transistors TS1 and TS2 are turned off. The fourth driving transistor TD4 is turned on by the voltage of the first node n1, so the third node n3 maintains the gate-off voltage Voff. Since the third node n3 has the gate-off voltage Voff, the first interception transistor TC1 and the second interception transistor TC2 are kept off. Since the first switching transistor TS1, the second switching transistor TS2, the first interception transistor TC1, and the second interception transistor TC2 are kept off, the first node n1 floats.

In addition, the first driving transistor TD1 is turned on by the voltage of the first node n1, and the output terminal OUT receives the clock signal CK that has the gate-on voltage Von. The voltage of the first node n1 is boosted to ΔVCK+Vboost by the voltage of the output terminal OUT and the boosting capacitor Cb. Because of this, the gate-source voltage Vgs of the first driving transistor TD1 is maintained so that the first driving transistor TD1 operates in a saturation region. Here, Vboost denotes a voltage boost by the boosting capacitor Cb, and may be expressed as follows:

$$Vboost = (Cb/\text{charged component at first node } n1) \times \Delta VOUT,$$

where ΔVOUT represents the voltage variation (e.g., swing width) of the output terminal OUT.

Since the voltage of the first node n1 is boosted through the boosting capacitor Cb, the voltage of the output terminal OUT can secure its full swing. The second node n2 is maintained at the ΔVCK−Vth_TI1 or ΔVCK−Vth_TI2 (where Vth_TI2 is the threshold voltage of the second input transistor TI2) level in the third period P3 and thus, the gate-source voltages Vgs of the first switching transistor TS1, the second switching transistor TS2, the first interception capacitor TC1, and the second interception capacitor TC2 fall to negative values. Accordingly, in the third period P3, the leakage current through the first switching transistor TS1, the second switching transistor TS2, the first interception capacitor TC1, and the second interception capacitor TC2 decreases significantly to maintain the voltage of the first node n1 at ΔVCK+Vboost.

In the third period P3, the second node n2 is connected to the second input terminal G−1 when the second input terminal G−1 has the gate-on voltage Von (and thus, the first input transistor TI1 is turned on) or is connected to the third input terminal G+1 when the third input terminal G+1 has the gate-on voltage Von (and thus, the second input transistor TI2 is turned on). Accordingly, the second node n2 is not floated in the third period P3 and thus, the possibility that the gate driver 200 malfunctions is lowered even if the surrounding environment changes.

In addition, in the third period P3, the second node n2 is connected to the output terminal OUT since the output terminal OUT has the gate-on voltage Von (and thus, the third input transistor TI3 is turned on). Since the second node n2 is connected to the output terminal OUT in addition to the second input terminal G−1 and the third input terminal G+1, the possibility that the gate driver 200 malfunctions due to the change of the surrounding environment can be further lowered. Another embodiment of the k-th stage STk will now be described with reference to FIG. 6.

Figure 6:
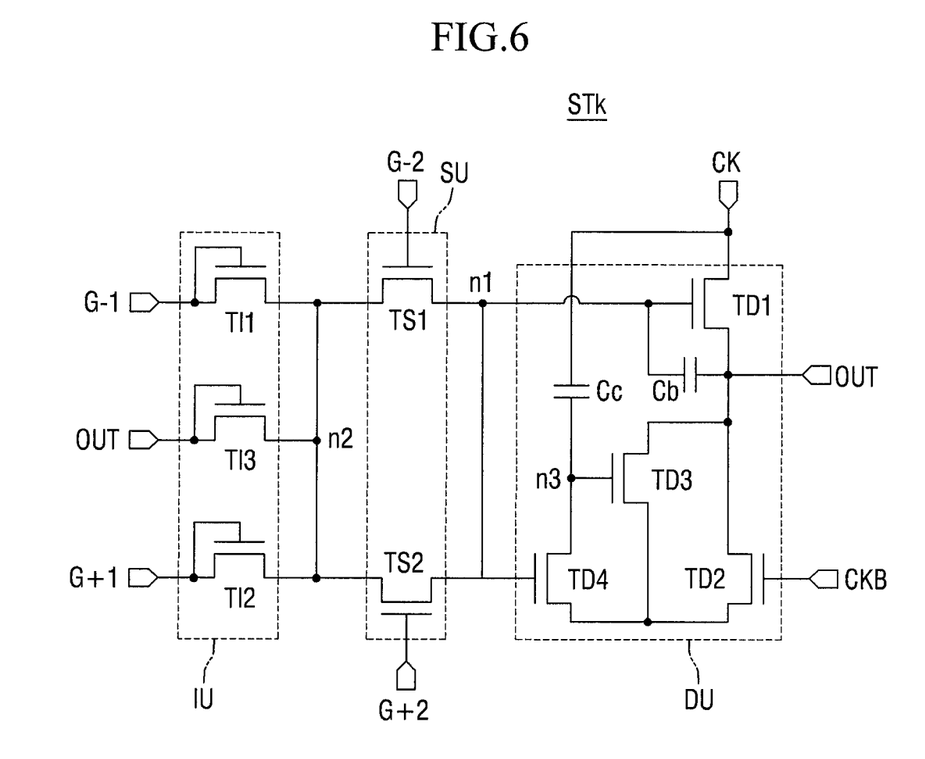
FIG. 6 is a circuit diagram of a k-th stage according to another embodiment of the present invention.

FIG. 6 is a circuit diagram of the k-th stage according to another embodiment of the present invention.

The k-th stage of FIG. 6 includes an input unit IU, a switching unit SU, and a driving unit DU. The input unit IU, the switching unit SU, and the driving unit DU may be substantially the same as the configurations having the same names in FIG. 4. That is, the leakage current interception unit CU and the reset unit RU may be omitted from the k-th stage. The k-th stage of FIG. 6 may be applied to the first to n-th stages ST1, ST2, STk in FIG. 3. Another display device will now be described with reference to FIG. 7.

Figure 7:
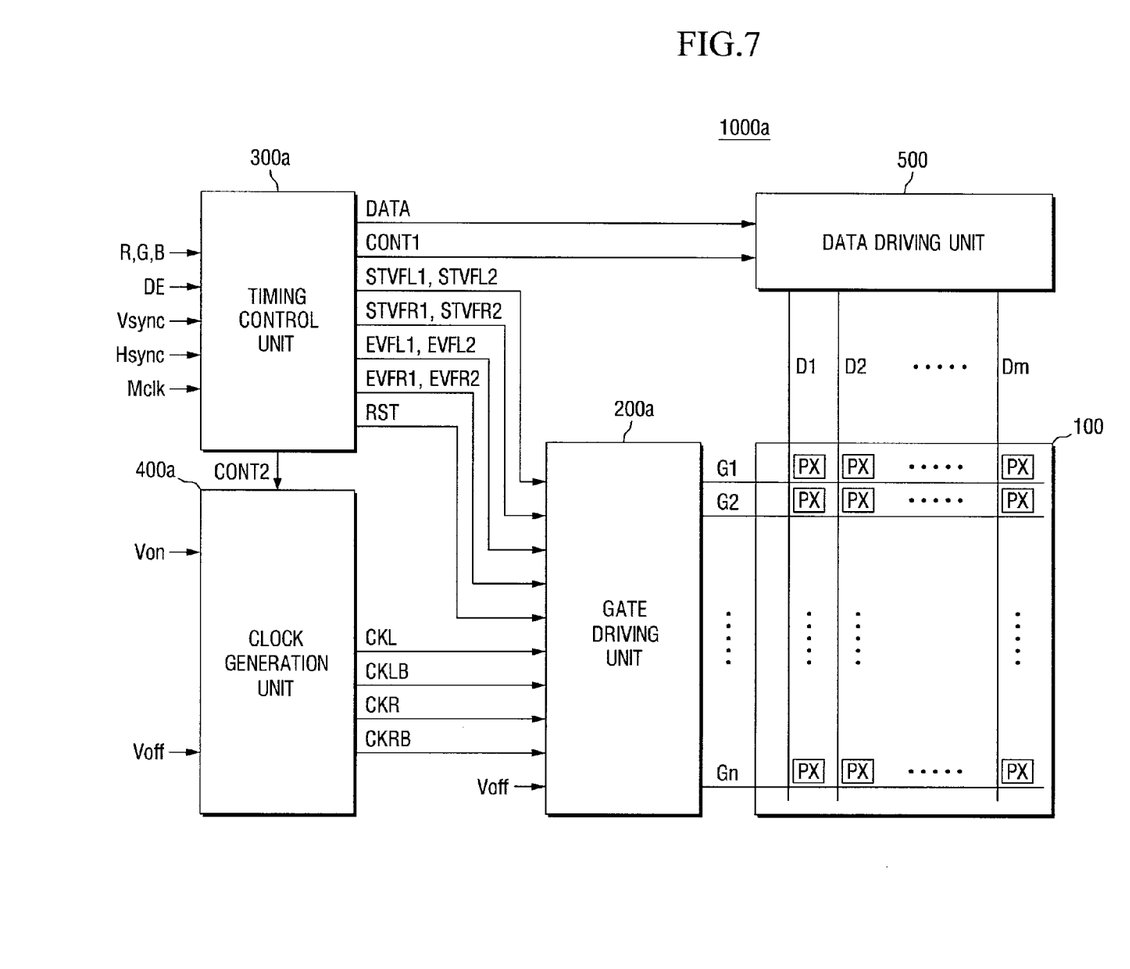
FIG. 7 is a block diagram of a display device according to another embodiment of the present invention.

FIG. 7 is a block diagram of a display device 1000a according to another embodiment of the present invention.

The display device 1000a includes a display panel 100 and a gate driving unit (for example, a gate driver) 200a. The display panel 100 is substantially the same as the configuration having the same name in FIG. 1. Accordingly, the description thereof will not be repeated.

The gate driver 200a provides the gate signal to the gate lines G1, G2, . . . , and Gn using a first start pulse signal STVFL1, a second start pulse signal STVFL2, a third start pulse signal STVFR1, a fourth start pulse signal STVFR2, a first end pulse signal EVFL1, a second end pulse signal EVFL2, a third end pulse signal EVFR1, a fourth end pulse signal EVFLR2, a reset signal RST, a first clock signal CKL, a second clock signal CKR, a first inverted clock signal CKLB, a second inverted clock signal CKRB, and a gate-off voltage Voff. The details of the gate driver 200a will be described later with reference to FIG. 8.

The display device 1000a further includes a timing control unit (for example, a timing controller) 300a, a data driving unit (for example, a data driver) 500, and a clock generation unit (for example, a clock generator) 400a. The timing controller 300a receives input image signals R, G, B and input control signals for controlling the display of the input image signals R, G, B, and generates and provides image data signals DATA and a data driver control signal CONT1 to the data driver 500. The timing controller 300a receives the input control signals, such as a vertical synchronization signal Vsync, a horizontal synchronization signal Hsync, a main clock signal Mclk, and a data enable signal DE, and outputs the data driver control signal CONT1. Here, the data driver control signal CONT1 is a signal for controlling the operation of the data driver 500, and may include, for example, a horizontal start signal for starting the operation of the data driver 500, a load signal for controlling an output of a data voltage, and the like.

The timing controller 300a also provides a clock generation control signal CONT2 to the clock generator 400a. The clock generation control signal CONT2 may include, for example, a gate clock signal for determining an output time of a gate-on voltage Von of the clock generator 400a, and an output enable signal for determining a pulse width of the gate-on voltage Von. The timing controller 300a also provides the first start pulse signal STVFL1, the second start pulse signal STVFL2, the third start pulse signal STVFR1, the fourth start pulse signal STVFR2, the first end pulse signal EVFL1, the second end pulse signal EVFL2, the third end pulse signal EVFR1, the fourth end pulse signal EVFR2, and the reset signal RST to the gate driver 200a.

The data driver 500 in FIG. 7 is substantially the same as the configuration having the same name in FIG. 1. Accordingly, the description thereof will not be repeated. The clock generator 400a generates the first clock signal CKL, the second clock signal CKR, the first inverted clock signal CKLB, and the second inverted clock signal CKRB corresponding to the clock generation control signal CONT2. The first inverted clock signal CKLB may be, for example, an inverted signal of the first clock signal CKL or a signal having a delay of ½ period from the first clock signal CKL. The second inverted clock signal CKRB may be, for example, an inverted signal of the second clock signal CKR or a signal having a delay of ½ period from the second clock signal CKR. The second clock signal CKR may be a signal having a delay of ¼ period from the first clock signal CKL. The gate driver 200a will now be described in more detail with reference to FIG. 8.

Figure 8:
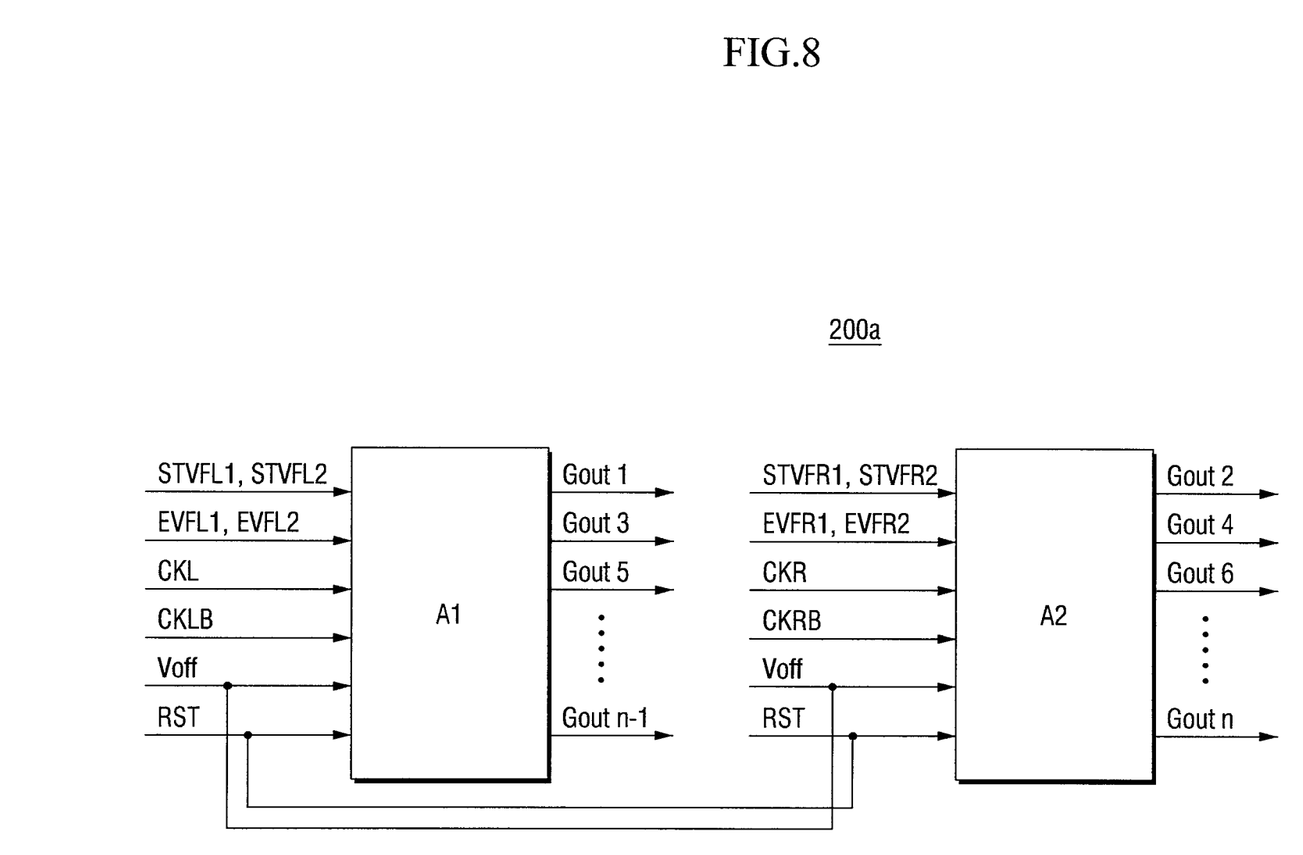
FIG. 8 is a block diagram of a gate driver according to another embodiment of the present invention.

FIG. 8 is a block diagram of the gate driver 200a according to another embodiment of the present invention.

The gate driver 200a includes a first array A1 and a second array A2. The first array A1 receives the first start pulse signal STVFL1, the second start pulse signal STVFL2, the first end pulse signal EVFL1, the second end pulse signal EVFL2, the reset signal RST, the first clock signal CKL, the first inverted clock signal CKLB, the gate-off voltage Voff, and the reset signal RST, and generates output signals Gout1, Gout3, Gout5, . . . , and Goutn−1 that are respectively applied to the odd-numbered gate lines G1, G3, G5, . . . , and Gn−1. The first array A1 will be described in more detail with reference to FIG. 9.

Figure 9:
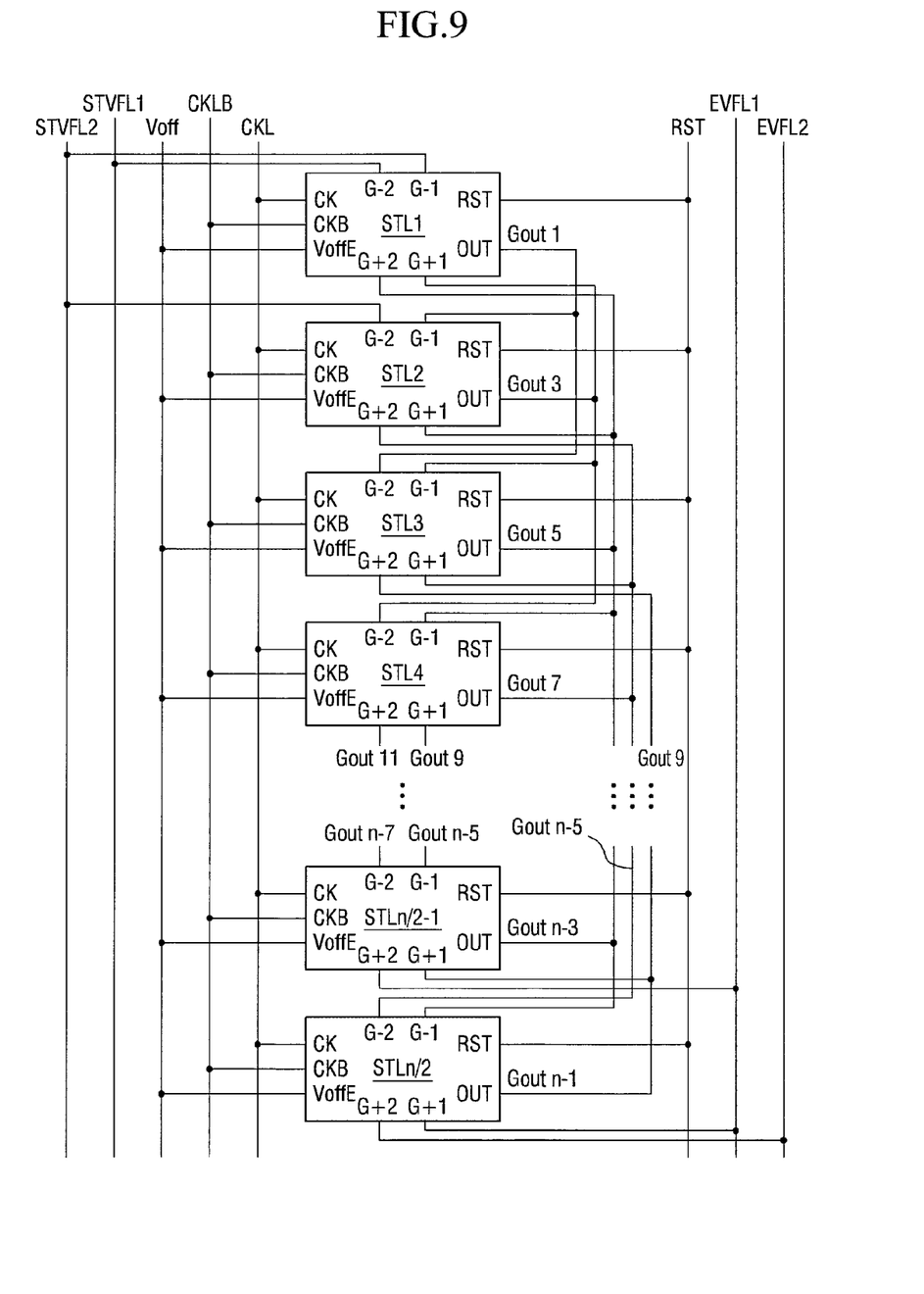
FIG. 9 is a block diagram of a first array according to an embodiment of the present invention.

FIG. 9 is a block diagram of the first array A1 according to an embodiment of the present invention.

The first array A1 includes first to n/2-th stages STL1, STL2, . . . , and STLn/2 that are cascade-connected to one another. Each of the first to n/2-th stages STL1, STL2, . . . , and STLn/2 includes the first input terminal G−2, the second input terminal G−1, the third input terminal G+1, the fourth input terminal G+2, the clock terminal CK, the inverted clock terminal CKB, the off-voltage terminal VoffE, the reset terminal RST, and the output terminal OUT.

The first input terminal G−2 of the k-th stage STLk is connected to the output terminal OUT of the (k−2)-th stage STLk−2, with the first input terminal G−2 of the first stage STL1 receiving the first start pulse signal STVFL1 and the first input terminal G−2 of the second stage STL2 receiving the second start pulse signal STVFL2. The second input terminal G−1 of the k-th stage STLk is connected to the output terminal OUT of the (k−1)-th stage STLk−1, with the second input terminal G−1 of the first stage STL1 receiving the second start pulse signal STVFL2. The third input terminal G+1 of the k-th stage STLk is connected to the output terminal OUT of the (k+1)-th stage STLk+1, with the third input terminal G+1 of the n/2-th stage STLn/2 receiving the first end pulse signal EVFL1. The fourth input terminal G+2 of the k-th stage STLk is connected to the output terminal OUT of the (k+2)-th stage STLk+2, with the fourth input terminal G+2 of the n/2-th stage STLn/2 receiving the second end pulse signal EVFL2 and the fourth input terminal G+2 of the (n/2−1)-th stage STLn/2−1 receiving the first end pulse signal EVFL1.

The first clock signal CKL is input to the clock terminal CK, the first inverted clock signal CKLB is input to the inverted clock terminal CKB, the gate-off voltage Voff is input to the off-voltage terminal VoffE, and the reset signal RST is input to the reset terminal RST. The configuration of the first to n/2-th stages STL1, STL2, . . . , and STLn/2 is substantially the same as the k-th stage STk in FIG. 6. Accordingly, further description thereof will not be repeated.

Referring again to FIG. 8, the second array A2 receives the third start pulse signal STVFR1, the fourth start pulse signal STVFR2, the third end pulse signal EVFR1, the fourth end pulse signal EVFR2, the reset signal RST, the second clock signal CKR, the second inverted clock signal CKRL, the gate-off voltage Voff, and the reset signal RST, and generates output signals Gout2, Gout4, Gout6, . . . , and Goutn that are applied to the even-numbered gate lines G2, G4, G6, . . . , and Gn. The second array A2 will now be described in more detail with reference to FIG. 10.

Figure 10:
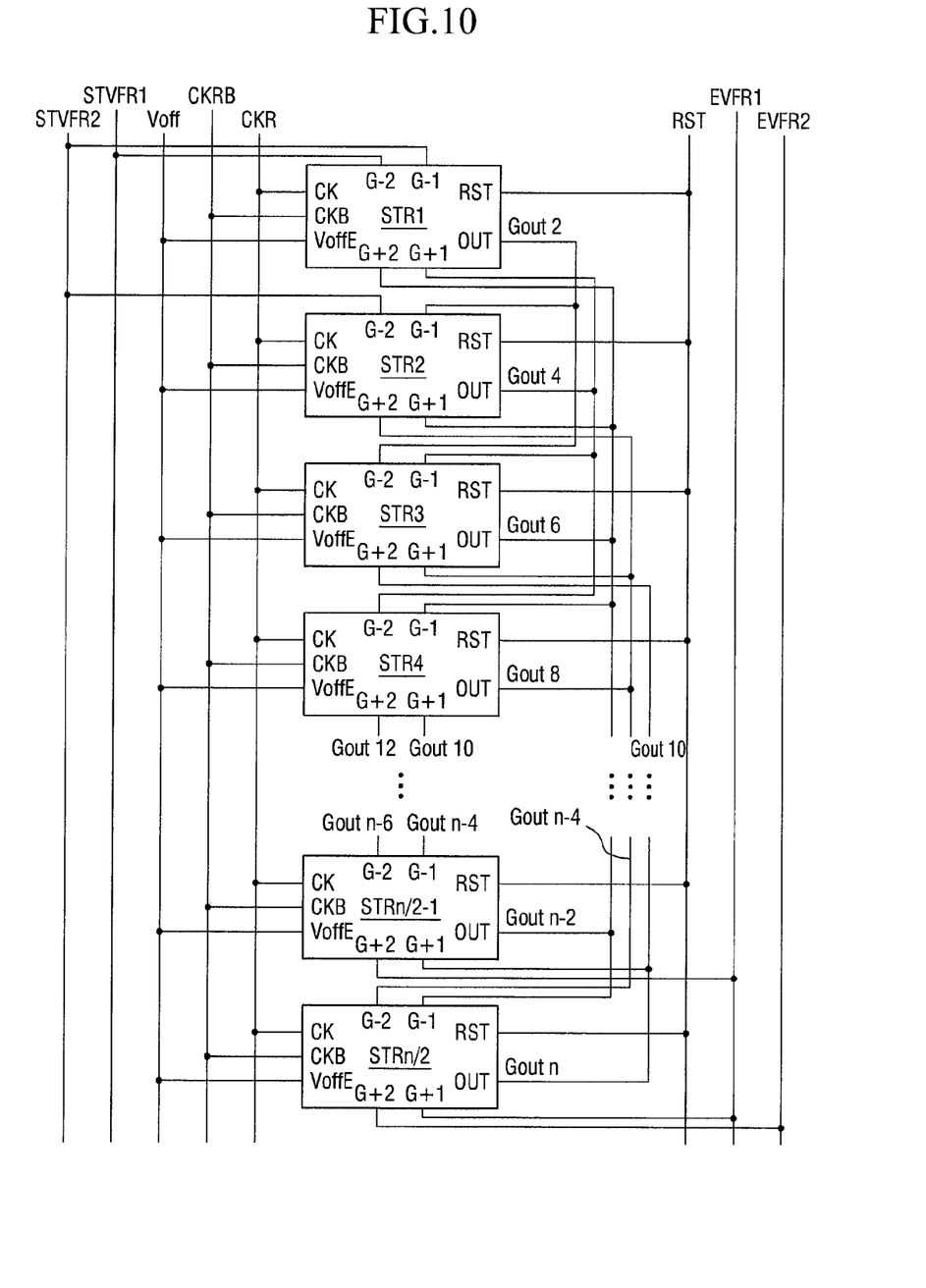
FIG. 10 is a block diagram of a second array according to an embodiment of the present invention.

FIG. 10 is a block diagram of the second array A2 according to an embodiment of the present invention.

The second array A2 includes first to n/2-th stages STR1, STR2, . . . , and STRn/2 that are cascade-connected to one another. Each of the first to n/2-th stages STR1, STR2, . . . , and STRn/2 includes the first input terminal G−2, the second input terminal G−1, the third input terminal G+1, the fourth input terminal G+2, the clock terminal CK, the inverted clock terminal CKB, the off-voltage terminal VoffE, the reset terminal RST, and the output terminal OUT.

The first input terminal G−2 of the k-th stage STRk is connected to the output terminal OUT of the (k−2)-th stage STRk−2, with the first input terminal G−2 of the first stage STR1 receiving the third start pulse signal STVFR1 and the first input terminal G−2 of the second stage STR2 receiving the fourth start pulse signal STVFR2. The second input terminal G−1 of the k-th stage STRk is connected to the output terminal OUT of the (k−1)-th stage STRk−1, with the second input terminal G−1 of the first stage STR1 receiving the fourth start pulse signal STVFR2. The third input terminal G+1 of the k-th stage STRk is connected to the output terminal OUT of the (k+1)-th stage STRk+1, with the third input terminal G+1 of the n/2-th stage STRn/2 receiving the third end pulse signal EVFR1. The fourth input terminal G+2 of the k-th stage STRk is connected to the output terminal OUT of the (k+2)-th stage STRk+2, with the fourth input terminal G+2 of the n/2-th stage STRn/2 receiving the fourth end pulse signal EVFR2 and the fourth input terminal G+2 of the (n/2−1)-th stage STRn/2−1 receiving the third end pulse signal EVFR1.

The second clock signal CKR is input to the clock terminal CK, the second inverted clock signal CKRB is input to the inverted clock terminal CKB, the gate-off voltage Voff is input to the off-voltage terminal VoffE, and the reset signal is input to the reset terminal RST. The configuration of the first to n/2-th stages STR1, STR2, . . . , and STRn/2 is substantially the same as the k-th stage STk in FIG. 6. Accordingly, further description thereof will not be repeated.

Although embodiments of the present invention have been described for illustrative purposes, those skilled in the art will appreciate that various modifications, additions, and substitutions are possible without departing from the scope and spirit of the invention as disclosed in the accompanying claims, and equivalents thereof.

What is claimed is:

1. A gate driver comprising a plurality of cascade-connected stages, a k-th stage of the stages comprising:
    a switching unit for connecting a first node to a second node;
    a driving unit for generating an output signal in accordance with a voltage of the first node, the output signal of the k-th stage overlapping both the output signal of a (k−1)-th stage of the stages and the output signal of a (k+1)-th stage of the stages; and
    an input unit for inputting the output signal of the (k−1)-th stage, the output signal of the k-th stage, and the output signal of the (k+1)-th stage to the second node such that the inputting of the output signal of the k-th stage to the second node overlaps both the inputting of the output signal of the (k−1)-th stage to the second node and the inputting of the output signal of the (k+1)-th stage to the second node.

2. The gate driver of claim 1, wherein
    the k-th stage further comprises an output terminal for outputting the output signal,
    the driving unit comprises a boosting capacitor between the output terminal and the first node, and the boosting capacitor is configured to boost a voltage of the first node by a voltage of the output terminal when the first node is in a high impedance state.

3. The gate driver of claim 1, wherein the k-th stage further comprises a leakage current interception unit for intercepting leakage current from the first node to the second node by maintaining high impedance between the second node and the first node when the first node is in a high impedance state.

4. The gate driver of claim 1, wherein the input unit comprises:
a first diode-connected transistor for inputting the output signal of the (k−1)-th stage to the second node; and
a second diode-connected transistor for inputting the output signal of the (k+1)-th stage to the second node.

5. The gate driver of claim 1, wherein the input unit comprises a third diode-connected transistor for inputting the output signal of the k-th stage to the second node.

6. The gate driver of claim 1, wherein the k-th stage is configured to reset a voltage of the first node and the output signal.

7. The gate driver of claim 6,
wherein the k-th stage further comprises a reset unit connected to a reset terminal for receiving a reset signal and a gate-off terminal for receiving a gate-off signal, and
wherein the reset unit comprises:
a fourth transistor comprising a gate electrode connected to the reset terminal, a first electrode connected to the first node, and a second electrode connected to the second node; and
a fifth transistor comprising a gate electrode connected to the reset terminal, a first electrode connected to the second node, and a second electrode connected to the gate-off terminal.

8. The gate driver of claim 7,
wherein the k-th stage further comprises an output terminal for outputting the output signal, and
wherein the reset unit further comprises a sixth transistor comprising a gate electrode connected to the reset terminal, a first electrode connected to the output terminal, and a second electrode connected to the gate-off terminal.

9. The gate driver of claim 1, wherein in the k-th stage, the switching unit is configured to connect the first node to the second node in accordance with the output signal of a (k−2)-th stage of the stages and the output signal of a (k+2)-th stage of the stages.

10. A display device comprising:
a display panel; and
a gate driver for providing a gate signal to the display panel,
wherein
the gate driver comprises a plurality of cascade-connected stages, and a k-th stage of the stages comprises:
a switching unit for connecting a first node to a second node;
a driving unit for generating an output signal in accordance with a voltage of the first node, the output signal of the k-th stage overlapping both the output signal of a (k−1)-th stage of the stages and the output signal of a (k+1)-th stage of the stages; and
an input unit for inputting the output signal of the (k−1)-th stage, the output signal of the k-th stage, and the output signal of the (k+1)-th stage to the second node such that the inputting of the output signal of the k-th stage to the second node overlaps both the inputting of the output signal of the (k−1)-th stage to the second node and the inputting of the output signal of the (k+1)-th stage to the second node.

11. The display device of claim 10, wherein
the k-th stage further comprises an output terminal for outputting the output signal,
the driving unit comprises a boosting capacitor between the output terminal and the first node, and
the boosting capacitor is configured to boost a voltage of the first node by a voltage of the output terminal when the first node is in a high impedance state.

12. The display device of claim 10, wherein the k-th stage further comprises a leakage current interception unit for intercepting leakage current from the first node to the second node by maintaining high impedance between the second node and the first node when the first node is in a high impedance state.

13. The display device of claim 10, wherein the input unit comprises:
a first diode-connected transistor for inputting the output signal of the (k−1)-th stage to the second node; and
a second diode-connected transistor for inputting the output signal of the (k+1)-th stage to the second node.

14. The display device of claim 10, wherein the input unit comprises a third diode-connected transistor for inputting the output signal of the k-th stage to the second node.

15. The display device of claim 10, wherein the k-th stage is configured to reset a voltage of the first node and the output signal.

16. The display device of claim 15,
wherein the k-th stage further comprises a reset unit connected to a reset terminal for receiving a reset signal and a gate-off terminal for receiving a gate-off signal, and
wherein the reset unit comprises:
a fourth transistor comprising a gate electrode connected to the reset terminal, a first electrode connected to the first node, and a second electrode connected to the second node; and
a fifth transistor comprising a gate electrode connected to the reset terminal, a first electrode connected to the second node, and a second electrode connected to the gate-off terminal.

17. The display device of claim 16,
wherein the k-th stage further comprises an output terminal for outputting the output signal, and
wherein the reset unit further comprises a sixth transistor comprising a gate electrode connected to the reset terminal, a first electrode connected to the output terminal, and a second electrode connected to the gate-off terminal.

18. The display device of claim 10, wherein in the k-th stage, the switching unit is configured to connect the first node to the second node in accordance with the output signal of a (k−2)-th stage of the stages and the output signal of a (k+2)-th stage of the stages.

* * * * *